(12) United States Patent
Lee

(10) Patent No.: US 11,882,704 B2
(45) Date of Patent: Jan. 23, 2024

(54) SEMICONDUCTOR MEMORY DEVICE AND METHOD OF MANUFACTURING THE SEMICONDUCTOR MEMORY DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/992,300

(22) Filed: Nov. 22, 2022

(65) Prior Publication Data

US 2023/0085167 A1 Mar. 16, 2023

Related U.S. Application Data

(62) Division of application No. 17/081,616, filed on Oct. 27, 2020, now Pat. No. 11,538,830.

(30) Foreign Application Priority Data

Jun. 22, 2020 (KR) .................. 10-2020-0076050

(51) Int. Cl.
*H10B 43/27* (2023.01)
*H01L 21/311* (2006.01)
*H10B 43/35* (2023.01)

(52) U.S. Cl.
CPC ........ *H10B 43/27* (2023.02); *H01L 21/31105* (2013.01); *H10B 43/35* (2023.02)

(58) Field of Classification Search
None
See application file for complete search history.

(56) References Cited

U.S. PATENT DOCUMENTS

| | | | |
|---|---|---|---|
| 2015/0243672 A1* | 8/2015 | Kim | .................... H01L 29/7926 257/324 |
| 2017/0125540 A1* | 5/2017 | Park | ........................ H10B 41/27 |
| 2017/0243881 A1* | 8/2017 | Shin | .................. H01L 21/76224 |
| 2017/0278859 A1 | 9/2017 | Sharangpani et al. | |
| 2018/0097010 A1* | 4/2018 | Kim | .................... H01L 29/7926 |
| 2018/0130814 A1 | 5/2018 | Lee | |

FOREIGN PATENT DOCUMENTS

KR 1020130116607 A 10/2013
KR 1020140076797 A 6/2014

* cited by examiner

*Primary Examiner* — Khaja Ahmad
(74) *Attorney, Agent, or Firm* — William Park & Associates Ltd.

(57) ABSTRACT

Provided herein may be a semiconductor memory device and a method of manufacturing the same. The semiconductor memory device may include a stacked body including alternately stacked interlayer insulating layers and conductive patterns, and channel structures penetrating the stacked body. Each of the channel structures may include a channel layer vertically extending up to the height of the upper portion of at least one upper conductive pattern disposed uppermost, among the conductive patterns, a memory layer surrounding the channel layer and extending from the lower interlayer insulating layer to the height of the middle portion of the upper conductive pattern, and a doped semiconductor pattern disposed above the channel layer and the memory layer.

6 Claims, 16 Drawing Sheets ated on Oct. 27, which protrudes with respect to the upper surface of the
SEMICONDUCTOR MEMORY DEVICE AND METHOD OF MANUFACTURING THE SEMICONDUCTOR MEMORY DEVICE

CROSS-REFERENCE TO RELATED APPLICATION

The present application is a divisional application of U.S. patent application Ser. No. 17/081,616, filed on Oct. 27, 2020, and claims priority under 35 U.S.C. § 119(a) to Korean patent application number 10-2020-0076050, filed on Jun. 22, 2020, in the Korean Intellectual Property Office, the entire disclosure of which is incorporated herein by reference.

BACKGROUND

1. Technical Field

Various embodiments of the present disclosure generally relate to a semiconductor memory device and a method of manufacturing the semiconductor memory device, and more particularly to a 3D semiconductor memory device and a method of manufacturing the 3D semiconductor memory device.

2. Related Art

A semiconductor memory device is a device for storing data under the control of a host device, such as a computer, a smartphone, or the like. The semiconductor memory device may be classified as a volatile memory device or a nonvolatile memory device.

The volatile memory device is a memory device configured such that data is stored only when power is supplied thereto and such that data stored therein is deleted when a power supply is interrupted. The volatile memory device includes a Static Random Access Memory (SRAM), a Dynamic Random Access Memory (DRAM), and the like.

The nonvolatile memory device is a memory device configured such that data is not deleted even though a power supply is interrupted, and includes a Read Only Memory (ROM), a Programmable ROM (PROM), an Electrically Programmable ROM (EPROM), an Electrically Erasable and Programmable ROM (EEPROM), a flash memory, and the like.

A semiconductor memory device includes memory cells capable of storing data. A 3D semiconductor memory device includes memory cells arranged in 3D, thereby reducing the area occupied by the memory cells per unit area of a substrate.

In order to improve a level of integration in a 3D semiconductor memory device, the number of stacked memory cells may be increased. As the number of stacked memory cells increases, the reliability of the operation of the 3D semiconductor memory device may be degraded.

SUMMARY

An embodiment of the present disclosure may provide for a semiconductor memory device. The semiconductor memory device may include a stacked body including alternately stacked interlayer insulating layers and conductive patterns, and channel structures penetrating the stacked body. Each of the channel structures may include a channel layer vertically extending up to the height of an upper portion of an upper conductive pattern disposed uppermost, among the conductive patterns, a memory layer surrounding the channel layer and extending from the lower interlayer insulating layer up to the height of a middle portion of the upper conductive pattern, and a doped semiconductor pattern disposed above the channel layer and the memory layer.

An embodiment of the present disclosure may provide for a semiconductor memory device. The semiconductor memory device may include a stacked body including alternately stacked interlayer insulating layers and conductive patterns, and channel structures penetrating the stacked body. Each of the channel structures may include a channel layer vertically extending up to the height of a portion of at least one upper conductive pattern disposed uppermost, among the conductive patterns, a memory layer surrounding the channel layer and extending up to a height lower than the upper surface of the channel layer, and a doped semiconductor pattern disposed above the channel layer and the memory layer, the channel layer including a protrusion, which protrudes with respect to the upper surface of the memory layer and extends into the doped semiconductor pattern.

An embodiment of the present disclosure may provide for a method of manufacturing a semiconductor memory device. The method may include forming a preliminary stacked body including alternately stacked interlayer insulating layers and sacrificial layers, forming a channel hole passing through the preliminary stacked body, forming a memory layer extending along the sidewall of the channel hole, forming a channel layer extending along the surface of the memory layer, forming a core insulating layer along the surface of the channel layer and thereby the core insulating layer filling the channel hole, etching the core insulating layer, the channel layer, and the memory layer disposed in an upper portion of the channel hole such that the channel layer has a protrusion protruding with respect to the core insulating layer and the memory layer, and forming a doped semiconductor pattern in the upper portion of the channel hole.

BRIEF DESCRIPTION OF THE DRAWINGS

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Specific structural or functional descriptions in the embodiments of the present disclosure introduced in this specification or application are only for description of the embodiments of the present disclosure. The embodiments conforming to the concept of the present disclosure may be implemented in various forms, and should not be construed as being limited to the embodiments described in the specification or application.

Hereinafter, although terms such as "first" and "second" may be used herein to describe various elements, the elements should not be limited by these terms. These terms are only used to distinguish one element from another element. For instance, a first element discussed below may be termed a second element without departing from the teachings of the present disclosure. Similarly, the second element may also be termed the first element.

Various embodiments of the present disclosure are directed to a semiconductor memory device capable of improving operation reliability and a method of manufacturing the semiconductor memory device.

Figure 1:
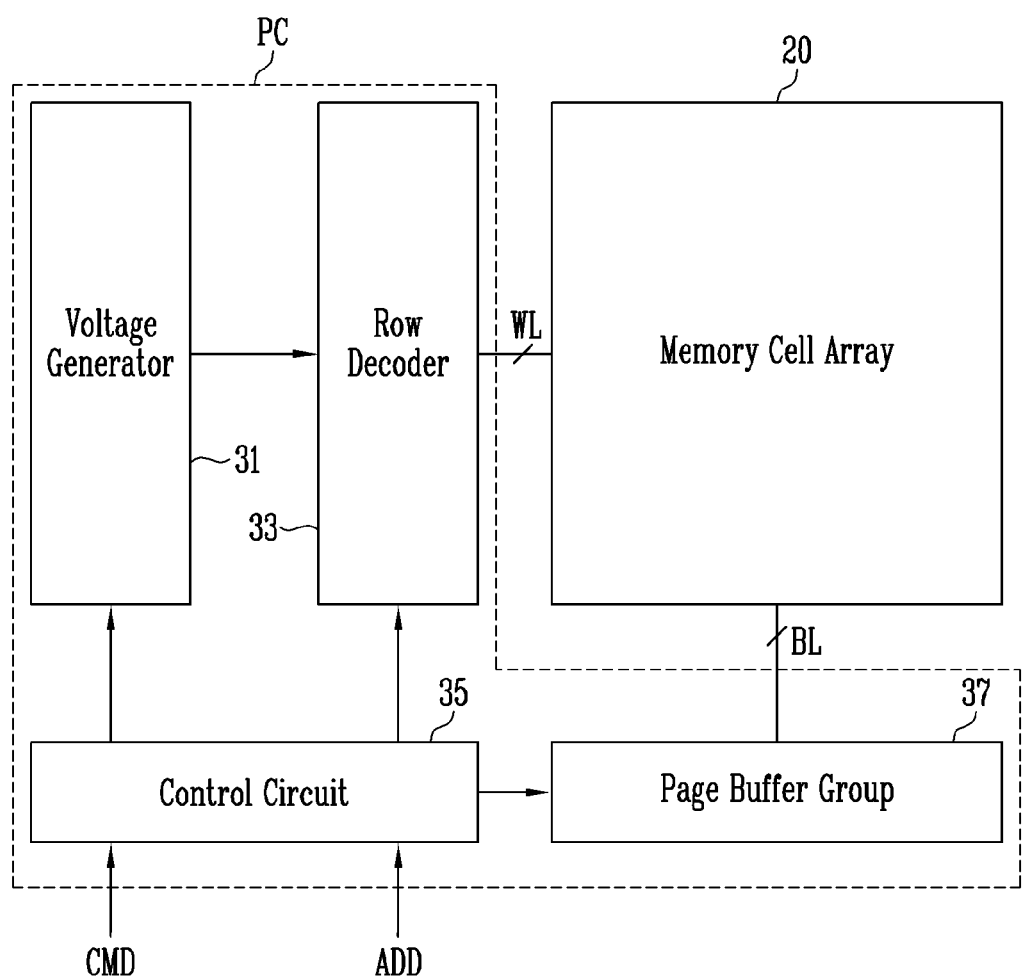
FIG. 1 is a block diagram illustrating a semiconductor memory device according to an embodiment of the present disclosure.

FIG. 1 is a block diagram illustrating a semiconductor memory device 10 according to an embodiment of the present disclosure.

Referring to FIG. 1, the semiconductor memory device 10 may include a peripheral circuit PC and a memory cell array 20.

The peripheral circuit PC may control a program operation of storing data in the memory cell array 20, a read operation of outputting data stored in the memory cell array 20, and an erase operation of erasing data stored in the memory cell array 20.

In an embodiment, the peripheral circuit PC may include a voltage generator 31, a row decoder 33, a control circuit 35, and a page buffer group 37.

The memory cell array 20 may include a plurality of memory blocks. The memory cell array 20 may be coupled to the row decoder 33 through word lines WL, and may be coupled to the page buffer group 37 through bit lines BL.

The control circuit 35 may control the peripheral circuit PC in response to a command CMD and an address ADD.

The voltage generator 31 may generate various operating voltages, such as a pre-erase voltage, an erase voltage, a ground voltage, a program voltage, a verify voltage, a pass voltage, and a read voltage, which are used for a program operation, a read operation, and an erase operation, under the control of the control circuit 35.

The row decoder 33 may select a memory block under the control of the control logic 35. The row decoder 33 may apply the operating voltages to word lines WL coupled to the selected memory block.

The page buffer group 37 may be coupled to the memory cell array 20 through the bit lines BL. The page buffer group 37 may temporarily store data received from an input/output circuit (not illustrated) under the control of the control circuit 35 during a program operation. The page buffer group 37 may sense voltages or currents of the bit lines BL under the control of the control circuit 35 during a read operation or a verify operation. The page buffer group 37 may select the bit lines BL under the control of the control circuit 35.

Structurally, the memory cell array 20 may overlap a part of the peripheral circuit PC.

Figure 2:
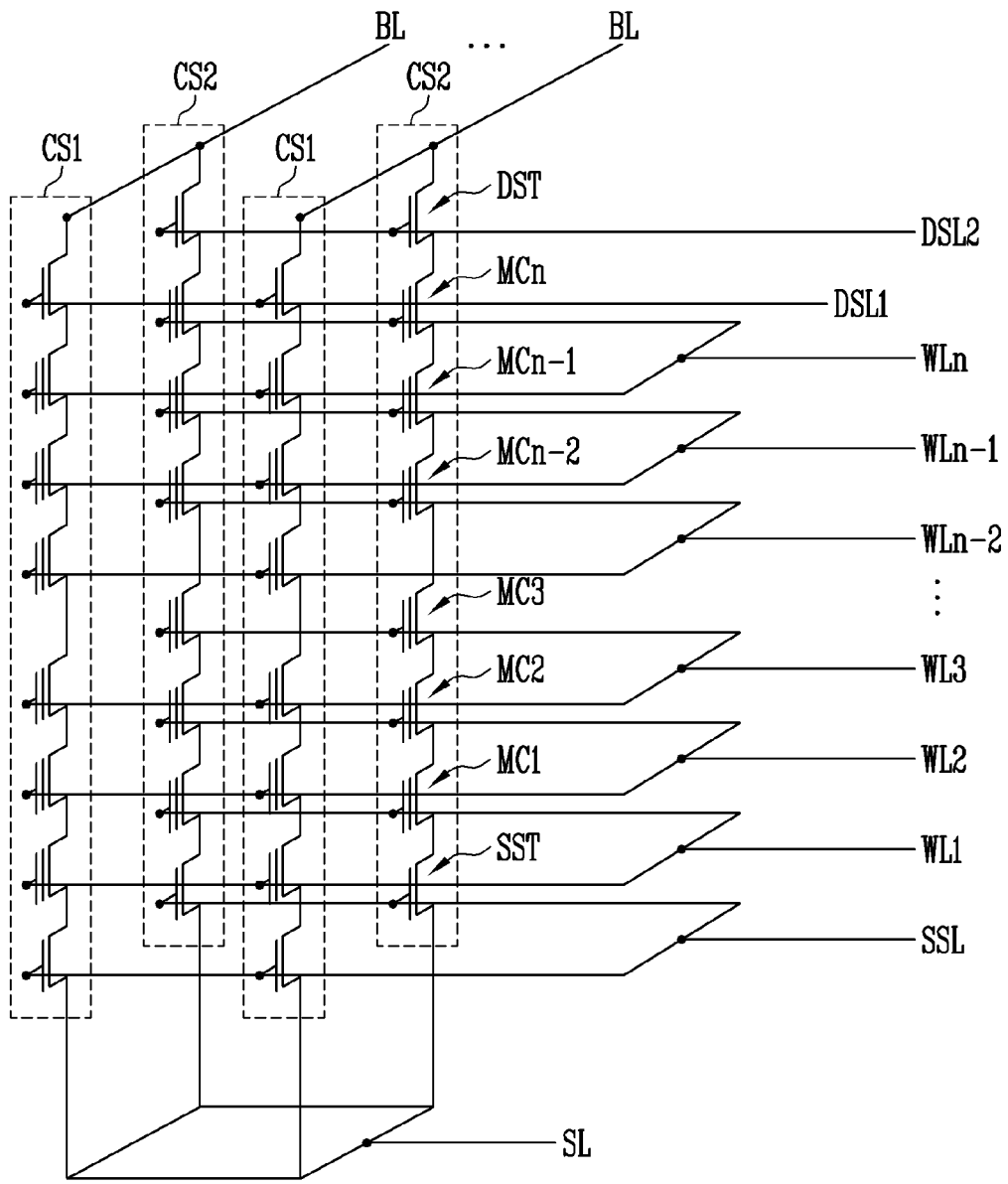
FIG. 2 is a circuit diagram illustrating a memory block according to an embodiment of the present disclosure.

FIG. 2 is a circuit diagram illustrating a memory block according to an embodiment of the present disclosure.

Referring to FIG. 2, the memory block may include a source layer SL, and a plurality of cell strings CS1 and CS2 coupled in common to a plurality of word lines WL1 to WLn. The plurality of cell strings CS1 and CS2 may be coupled to a plurality of bit lines BL.

Each of the plurality of cell strings CS1 and CS2 may include at least one source select transistor SST coupled to the source layer SL, at least one drain select transistor DST coupled to the bit line BL, and a plurality of memory cells MC1 to MCn coupled in series between the source select transistor SST and the drain select transistor DST.

The gates of the plurality of memory cells MC1 to MCn may be coupled to corresponding ones of the plurality of word lines WL1 to WLn, which are stacked in the state in which they are spaced apart from each other. The plurality of word lines WL1 to WLn may be disposed between a source select line SSL and two or more drain select lines DSL1 and DSL2. The two or more drain select lines DSL1 and DSL2 may be spaced apart from each other at the same level.

The gate of the source select transistor SST may be coupled to the source select line SSL. The gate of the drain select transistor DST may be coupled to the drain select line corresponding to the gate of the drain select transistor DST.

The source layer SL may be coupled to the source of the source select transistor SST. The drain of the drain select transistor DST may be coupled to the bit line corresponding to the drain of the drain select transistor DST.

The plurality of cell strings CS1 and CS2 may be classified into string groups that are coupled to the two or more drain select lines DSL1 and DSL2, respectively. The cell strings coupled to the same word line and the same bit line may be individually controlled by the different drain select lines. Also, the cell strings coupled to the same drain select line may be individually controlled by the different bit lines.

According to an embodiment, the two or more drain select lines DSL1 and DSL2 may include the first drain select line DSL1 and the second drain select line DSL2. The plurality of cell strings CS1 and CS2 may include the first cell string CS1 of a first string group coupled to the first drain select line DSL1 and the second cell string CS2 of a second string group coupled to the second drain select line DSL2.

Figure 3A:
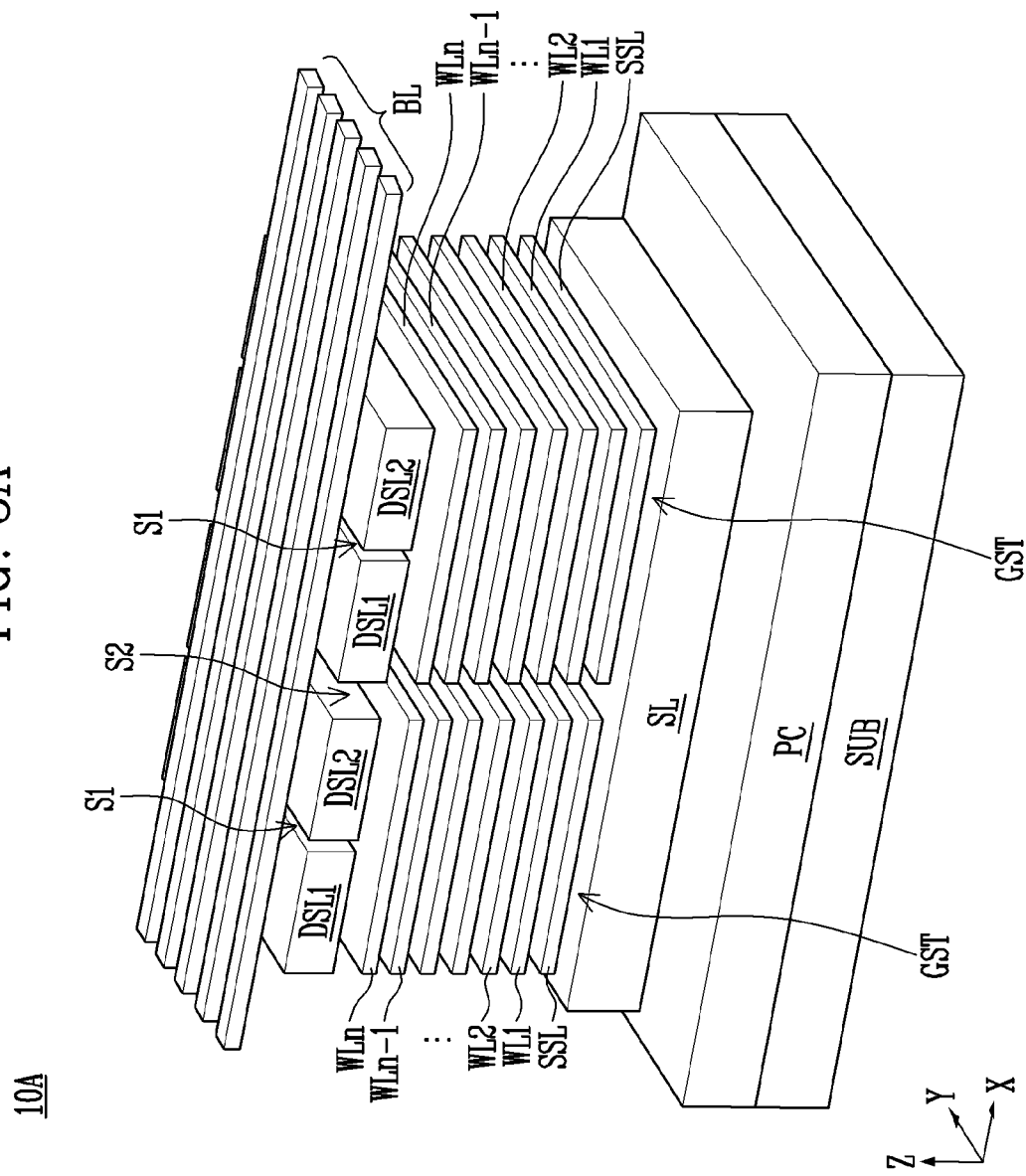
FIG. 3A and FIG. 3B are perspective views schematically illustrating semiconductor memory devices according to embodiments of the present disclosure.
Figure 3B:
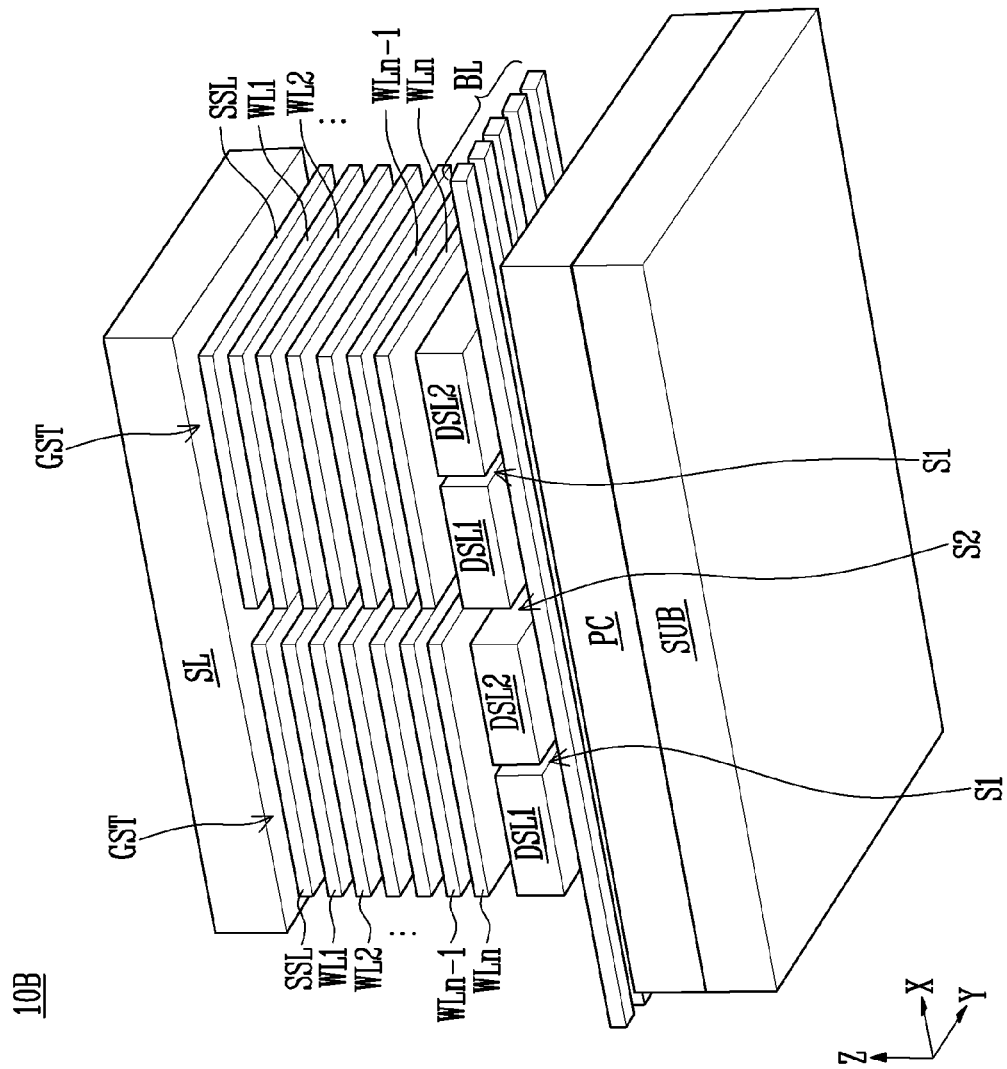

FIG. 3A and FIG. 3B are perspective views schematically illustrating semiconductor memory devices 10A and 10B according to embodiments of the present disclosure.

Referring to FIG. 3A and FIG. 3B, each of the semiconductor memory devices 10A and 10B may include a peripheral circuit PC disposed on a substrate SUB and gate stacked bodies GST that overlap the peripheral circuit PC.

Each of the gate stacked bodies GST may include a source select line SSL, a plurality of word lines WL1 to WLn, and two or more drain select lines DSL1 and DSL2 that are separated from each other by a first slit S1 at the same level.

The source select line SSL and the plurality of word lines WL1 to WLn may extend in a first direction X and a second direction Y, and may be formed in a plate type so as to be parallel to the upper surface of the substrate SUB. The first direction X may be the direction of the X-axis of an XYZ coordinate system, and the second direction Y may be the direction of the Y-axis of the XYZ coordinate system.

The plurality of word lines WL1 to WLn may be stacked in a third direction Z in the state in which they are spaced apart from each other. The third direction Z may be the direction of the Z-axis of the XYZ coordinate system. The plurality of word lines WL1 to WLn may be disposed between the source select line SSL and the two or more drain select lines DSL1 and DSL2. In an embodiment, the third direction Z may be the vertical direction. In an embodiment, the first direction X may be the horizontal direction.

The gate stacked bodies GST may be separated from each other by a second slit S2. The first slit S1 may be formed shorter than the second slit S2 with respect to the third direction Z, and may overlap the plurality of word lines WL1 to WLn.

Each of the first slit S1 and the second slit S2 may extend in a line type, in a zigzag type, or in a wave type. The width of each of the first slit S1 and the second slit S2 may be variously changed depending on a design rule.

Referring to FIG. 3A, the source select line SSL according to an embodiment may be disposed closer to the peripheral circuit PC than the two or more drain select lines DSL1 and DSL2.

The semiconductor memory device 10A may include a source layer SL disposed between the peripheral circuit PC and the gate stacked bodies GST and a plurality of bit lines BL spaced farther apart from the peripheral circuit PC than the source layer SL. The gate stacked bodies GST may be disposed between the source layer SL and the plurality of bit lines BL.

Referring to FIG. 3B, the two or more drain select lines DSL1 and DSL2 according to an embodiment may be disposed closer to the peripheral circuit PC than the source select line SSL.

The semiconductor memory device 10B may include a plurality of bit lines BL disposed between the peripheral circuit PC and gate stacked bodies GST and a source layer SL spaced farther apart from the peripheral circuit PC than the plurality of bit lines BL. The gate stacked bodies GST may be disposed between the plurality of bit lines BL and the source layer SL.

Referring again to FIG. 3A and FIG. 3B, the plurality of bit lines BL may be formed of various conductive materials. The source layer SL may include a doped semiconductor layer. According to an embodiment, the source layer SL may include an n-type doped silicon layer.

Although not illustrated in the drawing, the peripheral circuit PC may be electrically coupled to the plurality of bit lines BL, the source layer SL, and the plurality of word lines WL1 to WLn through interconnections having various structures.

Figure 4:
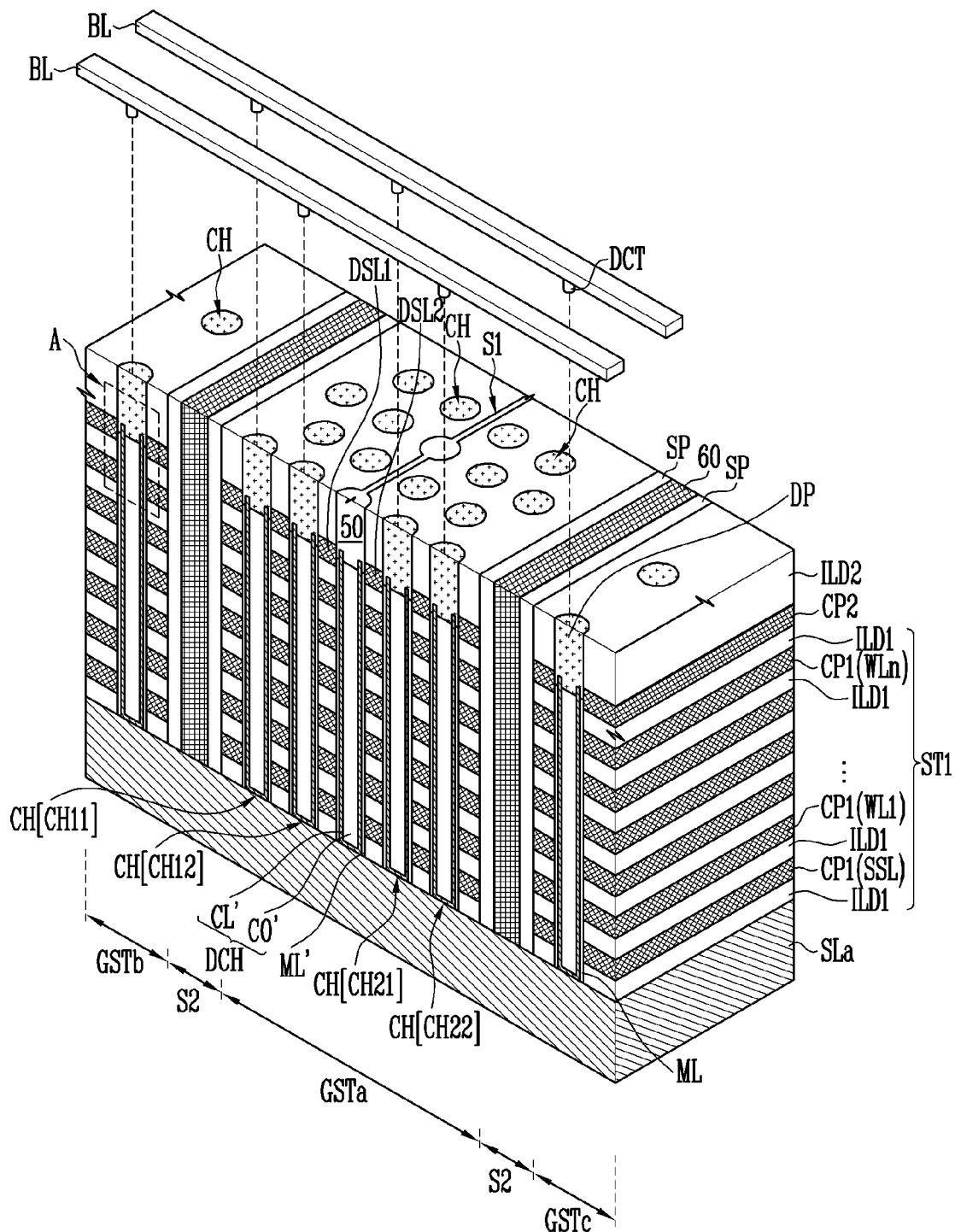
FIG. 4 is a perspective view illustrating the gate stacked bodies of a semiconductor memory device according to an embodiment of the present disclosure.

FIG. 4 is a perspective view illustrating the gate stacked bodies GSTa, GSTb and GSTc of a semiconductor memory device according to an embodiment of the present disclosure.

Referring to FIG. 4, each of the gate stacked bodies GSTa, GSTb and GSTc may include a first stacked body ST1 and a second stacked body ST2. The first stacked body ST1 and the second stacked body ST2 may be disposed between a source layer SLa and a plurality of bit lines BL.

The plurality of bit lines BL may overlap the first stacked body ST1, and the second stacked body ST2 may be disposed between the first stacked body ST1 and the plurality of bit lines BL. The plurality of bit lines BL may overlap the source layer SLa.

The first stacked body ST1 may include alternately stacked first interlayer insulating layers ILD1 and first conductive patterns CP1. The first conductive patterns CP1 may be used as a source select line SSL and a plurality of word lines WL1 to WLn.

Figure 5:
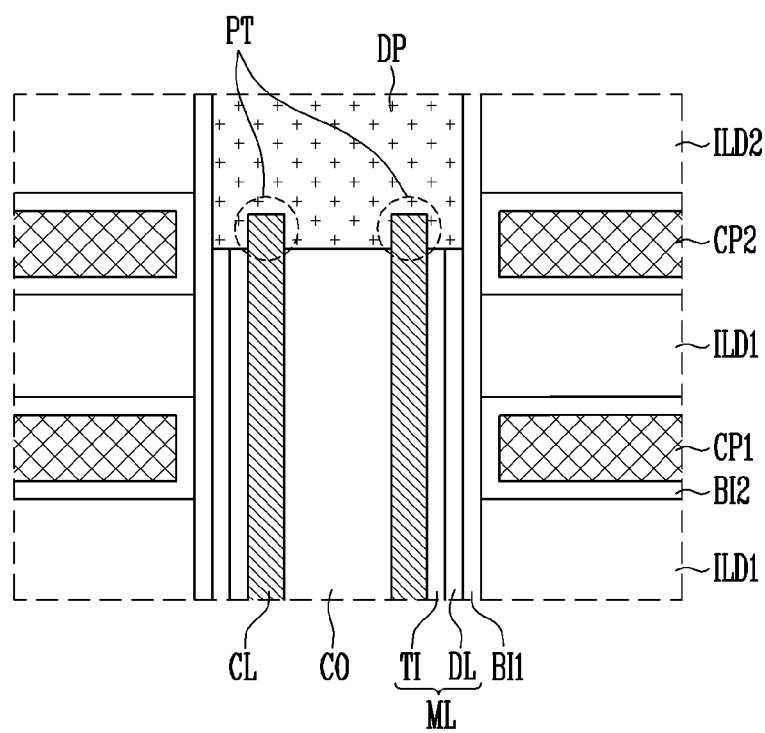
FIG. 5 is an enlarged sectional view of the area A illustrated in FIG. 4.

The second stacked body ST2 may include a second conductive pattern CP2 and a second interlayer insulating layer ILD2. The second conductive pattern CP2 may be disposed between the second interlayer insulating layer ILD2 and the first interlayer insulating layers ILD1 disposed in the upper portion of the first stacked body ST1. The second conductive pattern CP2 and the second interlayer insulating layer ILD2 are sequentially disposed on the first stacked body ST1, thereby overlapping the first stacked body ST1. The second conductive pattern CP2 may be used as drain select lines DSL1 and DSL2. In an embodiment, the second conductive pattern CP2 as illustrated in FIGS. 4 and 5 may be an upper conductive pattern disposed uppermost, among the conductive patterns.

The second stacked body ST2 may be penetrated by a first slit S1. The second conductive pattern CP2 of the second stacked body ST2 may be separated into the drain select lines DSL1 and DSL2 by the first slit S1. According to an embodiment, each of the gate stacked bodies GSTa, GSTb and GSTc may include the first drain select line DSL1 and the second drain select line DSL2, which are separated by the first slit S1.

The gate stacked bodies GSTa, GSTb and GSTc may be separated from each other by second slits S2, each of which is formed deeper than the first slit S1. A spacer insulating layer SP may be formed on the sidewall of each of the second slits S2, and a vertical structure 60 may be formed inside each of the second slits S2. According to an embodiment, the vertical structure 60 is in contact with the source layer SLa, and may include a conductive material that fills the inside of each of the second slits S2. The present disclosure is not limited thereto. According to an embodiment, the vertical structure 60 may include an insulating material.

The first stacked body ST1 and the second stacked body ST2 of each of the gate stacked bodies GSTa, GSTb and GSTc may be penetrated by a plurality of channel structures CH. The plurality of channel structures CH may be arranged in a plurality of channel columns. The channel structures arranged in each channel column may include channel structures aligned in a line in the direction in which the bit lines BL extend. According to an embodiment, the channel structures arranged in each channel column may include first channel structures CH11 and CH12 and second channel structures CH21 and CH22. The first channel structures CH11 and CH12 may be disposed on one side of the first slit S1, and the second channel structures CH21 and CH22 may be disposed on the other side of the first slit S1. In other words, the first slit S1 may be disposed between the first channel structures CH11 and CH12 and the second channel structures CH21 and CH22.

According to an embodiment, the first channel structures CH11 and CH12 may extend to penetrate the first drain select line DSL1 and the first stacked body ST1. The second channel structures CH21 and CH22 may extend to penetrate the second drain select line DSL2 and the first stacked body ST1. Each of the second conductive pattern CP2, the second interlayer insulating layer ILD2, the first conductive patterns CP1, and the first interlayer insulating layers ILD1 may extend to surround the first channel structures CH11 and CH12 and the second channel structures CH21 and CH22.

Each of the bit lines BL may be electrically coupled to any one of the first channel structures CH11 and CH12 and any one of the second channel structures CH21 and CH22 via drain contact plugs DCT.

A dummy channel structure DCH may be disposed between the first channel structures CH11 and CH12 and the second channel structures CH21 and CH22. The dummy channel structure DCH may penetrate the first stacked body ST1. The first slit S1 may overlap the dummy channel structure DCH.

Each of the channel structures CH may include a core insulating layer CO, a doped semiconductor pattern DP, and a channel layer CL (see FIG. 5). The dummy channel structure DCH may include a dummy core insulating layer CO' and a dummy channel layer CL'.

The core insulating layer CO may be vertically formed in the center of each of the channel structures CH, and may be surrounded by the first stacked body ST1. The doped semiconductor pattern DP may overlap the core insulating layer CO, and may be surrounded by the second conductive pattern CP2 and the second interlayer insulating layer ILD2. According to an embodiment, the doped semiconductor pattern DP may include an n-type doped silicon layer. The channel layer CL may extend along the sidewall of the core insulating layer CO. That is, the channel layer CL may be configured to surround the sidewall of the core insulating layer CO. The first end portion of the channel layer CL may have a protrusion extending into the doped semiconductor pattern DR The second end portion of the channel layer CL may extend between the source layer SLa and the core insulating layer CO, and may be in contact with the source layer SLa. According to an embodiment, each of the channel layer CL and the dummy channel layer CL' may include an undoped silicon layer. The space between the first end portion of the channel layer CL and the second conductive pattern CP2 may be filled with the doped semiconductor pattern DP.

A dummy memory layer ML' may extend over the sidewall of an isolation insulating layer 50. The isolation insulating layer 50 may be disposed between the first drain select line DSL1 and the second drain select line DSL2. The isolation insulating layer 50 may fill the first slit S1, and may overlap the dummy channel structure DCH. The dummy memory layer ML' may include the same material layers as a memory layer ML.

Although not illustrated in the drawing, an upper insulating layer penetrated by the drain contact plug DCT may be disposed between the second stacked body ST2 and the plurality of bit lines BL.

The sidewall of each of the channel structures CH may be surrounded by the memory layer ML. The sidewall of the dummy channel structure DCH may be surrounded by the dummy memory layer ML'. The memory layer ML may be configured to surround a portion of the sidewall of the second conductive pattern CP2. Accordingly, the lower sidewall of the second conductive pattern CP2 may be in contact with the memory layer ML, and the upper sidewall of the second conductive pattern CP2 may be in contact with the doped semiconductor pattern DR In an embodiment, the lower sidewall of the second conductive pattern CP2 may be located at a level horizontally overlapping with a portion of the memory layer and the upper sidewall of the second conductive pattern CP2 may be located at a level horizontally overlapping with a portion of the doped semiconductor pattern DP. For example, the lower sidewall of the second conductive pattern CP2 may be located at a level horizontally overlapping with a portion of the memory layer as illustrated in FIG. 5. For example, the upper sidewall of the second conductive pattern CP2 may be located at a level horizontally overlapping with a portion of the doped semiconductor pattern DP as illustrated in FIG. 5. Because the doped semiconductor pattern DP is able to be surrounded by at least a portion of the second conductive pattern CP2, a junction overlap region may be secured at a channel under a drain select transistor. Accordingly, a Gate-Induced Drain Leakage (GIDL) current generated at the channel under the drain select transistor may be increased during the erase operation of the semiconductor memory device. The GIDL current may be generated due to the difference between an erase voltage applied to the bit line BL and a gate voltage applied to the second conductive pattern CP2.

A first blocking layer (not illustrated) may be disposed between the first stacked body ST1 and the memory layer ML and between the second conductive pattern CP2 and the memory layer ML.

FIG. 5 is an enlarged sectional view of the area A illustrated in FIG. 4.

Referring to FIG. 5, the memory layer ML may include a tunnel insulating layer TI and a data storage layer DL. The tunnel insulating layer TI may surround the sidewall of the channel layer CL. The tunnel insulating layer TI may include an insulating material enabling charge tunneling. According to an embodiment, the tunnel insulating layer TI may include a silicon oxide layer. The data storage layer DL may surround the sidewall of the tunnel insulating layer TI. The data storage layer DL may include a material layer capable of storing data. To this end, the data storage layer DL may be formed of a nitride layer enabling charge trapping. The present disclosure is not limited thereto, and the data storage layer DL may include a phase-change material, a nanodot, and the like.

The memory layer ML may extend along the sidewalls of the first interlayer insulating layers ILD1 and the first conductive patterns CP1 to the height of the middle portion of the sidewall of the second conductive pattern CP2. That is, the memory layer ML may overlap the middle portion of the sidewall of the second conductive pattern CP2. In an embodiment the memory layer ML may overlap a portion of the sidewall of the second conductive pattern CP2. In an embodiment, the memory layer ML may surround the channel layer CL and may extend up to a height lower than an upper surface of the channel layer CL that is in contact with the doped semiconductor pattern DP as shown in FIG. 5. In an embodiment, a portion of a sidewall of the second conductive pattern CP2 overlaps with the memory layer ML and a remaining portion of the sidewall of the second conductive pattern CP2, excluding the portion overlapping with the memory layer ML, overlaps with the doped semiconductor pattern DP.

The channel layer CL may surround the sidewall of the core insulating layer, and the channel layer CL may include a protrusion PT extending into the doped semiconductor pattern DP. Accordingly, a portion of the doped semiconductor pattern DP is disposed in the space between the second conductive pattern CP2 and the protrusion PT of the channel layer CL. That is, the channel layer CL may overlap the upper portion of the sidewall of the second conductive pattern CP2. In an embodiment, the channel layer CL may overlap a portion of the sidewall of the second conductive pattern CP2. In embodiment, a height of the channel layer CL may be greater than a height at which the memory layer contacts with the doped semiconductor pattern DP as shown in FIG. 5.

In the above-described embodiment, the memory layer ML has been described as extending to the height of the middle portion of the sidewall of the second conductive pattern CP2, the channel layer CL has been described as extending to the upper portion of the sidewall of the second conductive pattern CP2, and the upper portion of the sidewall of the second conductive pattern CP2 has been described as being higher than the middle portion of the sidewall of the second conductive pattern CP2. However, the upper portion and the middle portion of the sidewall of the second conductive pattern CP2 are not limited to specific positions in the sidewall of the second conductive pattern CP2.

The first blocking insulating layer BI1 may surround the sidewall of the data storage layer DL. The first blocking insulating layer BI1 may extend along the sidewall of the doped semiconductor pattern DP. The first blocking insulating layer BI1 may be disposed along the sidewalls of the first conductive patterns CP1, the first interlayer insulating layers ILD1, the second conductive pattern CP2, and the second interlayer insulating layer ILD2. The first blocking insulating layer BI1 may include an oxide.

The first conductive patterns CP1 may surround the memory layer ML between the first interlayer insulating layers ILD1. The first conductive patterns CP1 may include a conductive material having a lower resistance than silicon. According to an embodiment, the first conductive patterns CP1 may include a metal layer.

A second blocking insulating layer BI2 may be further formed between the first conductive pattern CP1 and the first blocking insulating layer BI1. The second blocking insulating layer BI2 may include an insulating material having a higher dielectric constant than the first blocking insulating layer BI1. According to an embodiment, the second blocking insulating layer BI2 may include a metal oxide layer. According to an embodiment, a metal oxide may include an aluminum oxide layer. The second blocking insulating layer BI2 may extend along the surface between the first conductive patterns CP1 and the first interlayer insulating layers ILD1.

The second conductive pattern CP2 may surround the memory layer ML between the first interlayer insulating layer ILD1 and the second interlayer insulating layer ILD2. Also, the second conductive pattern CP2 may surround a portion of the doped semiconductor pattern DP between the first interlayer insulating layer ILD1 and the second interlayer insulating layer ILD2. For example, the lower portion of the sidewall of the second conductive pattern CP2 may surround the memory layer ML, and the upper portion of the sidewall of the second conductive pattern CP2 may surround a portion of the doped semiconductor pattern DP. That is, the doped semiconductor pattern DP may overlap the upper portion of the sidewall of the second conductive pattern CP2. In an embodiment the doped semiconductor pattern DP may overlap a portion of the sidewall of the second conductive pattern CP2.

The second conductive pattern CP2 may be used as the drain select line DSL coupled to the gate of the drain select transistor DST, illustrated in FIG. 2. In an embodiment, the channel layer CL may vertically extend up to a height with an upper portion of at least one upper conductive pattern (i.e., CP2 of FIGS. 4 and 5) disposed upper most, among the conductive patterns. In an embodiment, the memory layer ML surrounding the channel layer CL and extended from a lower interlayer insulating layer (i.e., any one of Interlayer insulating layers ILD1 as shown in FIGS. 4 and 5) to a height substantially equal with a middle portion of the upper conductive pattern (i.e., CP2 of FIGS. 4 and 5).

The semiconductor memory device illustrated in FIG. 4 and FIG. 5 may be applied to the semiconductor memory device 10A illustrated in FIG. 3A. The semiconductor memory device Illustrated in FIG. 4 and FIG. 5 may be applied to the semiconductor memory device 10B illustrated in FIG. 3B after being turned upside down.

The channel layer CL may penetrate the memory layer ML and include a bottom surface that is in contact with the source layer SLa, as illustrated in FIG. 4. The embodiments of the present disclosure is not limited thereto.

Figure 6:
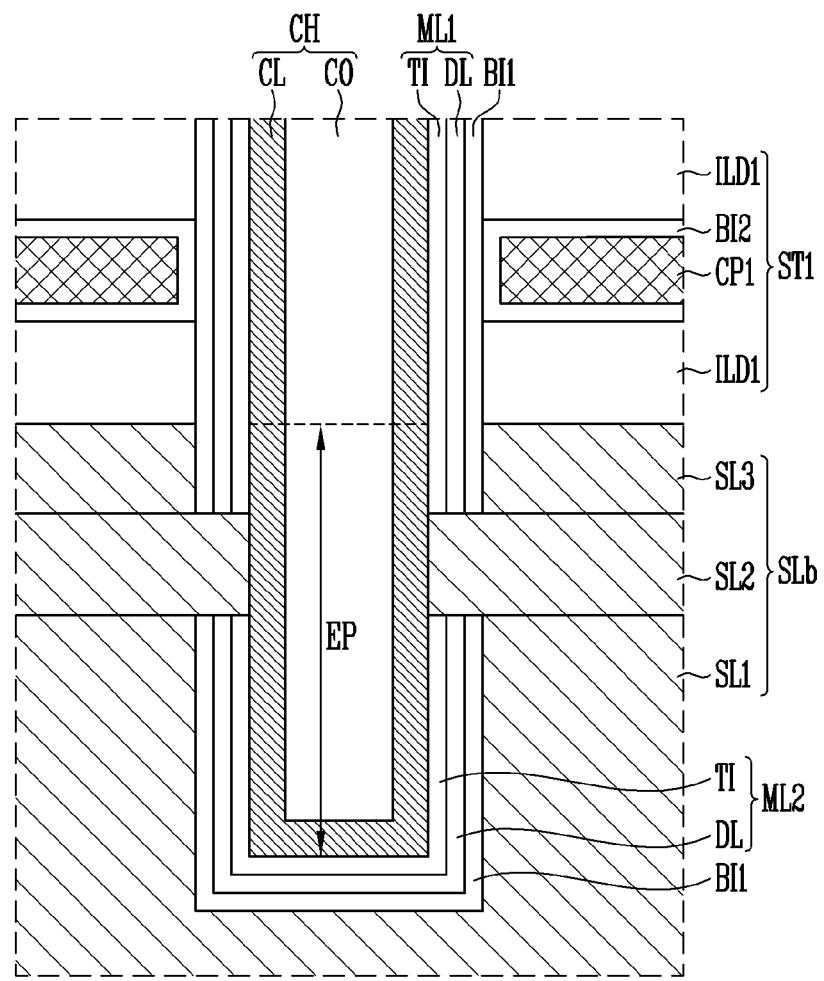
FIG. 6 is a sectional view illustrating a source layer and a channel structure according to an embodiment of the present disclosure.

FIG. 6 is a sectional view illustrating a source layer SLb and a channel structure CH according to an embodiment of the present disclosure. The structure illustrated in FIG. 6 may be applied to the semiconductor memory device 10A illustrated in FIG. 3A.

Referring to FIG. 6, the source layer SLb may include a first layer SL1 and a second layer SL2, or may include a first layer SL1, a second layer SL2, and a third layer SL3. The first layer SL1 may overlap a first stacked body ST1. The second layer SL2 may be disposed between the first stacked body ST1 and the first layer SL1. The third layer SL3 may be disposed between the second layer SL2 and the first stacked body ST1.

Each of the first layer SL1, the second layer SL2, and the third layer SL3 may include a doped semiconductor layer. According to an embodiment, each of the first layer SL1, the second layer SL2, and the third layer SL3 may include n-type doped silicon.

The first stacked body ST1 may include alternately stacked first interlayer insulating layers ILD1 and first conductive patterns CP1, as described with reference to FIG. 4, and may be penetrated by the channel structure CH.

The end portion EP of the channel structure CH may penetrate the third layer SL3 and the second layer SL2, and may extend into the first layer SL1. According to an embodiment, a channel layer CL and a core insulating layer CO may penetrate the third layer SL3 and the second layer SL2, and may extend into the first layer SL1.

Each of a data storage layer DL and a tunnel insulating layer TI may be separated into a first memory pattern ML1 and a second memory pattern ML2 by the second layer SL2. The second layer SL2 protrudes towards the channel layer CL with respect to the first layer SL1 and the third layer SL3, and may be in contact with the channel layer CL. A first blocking insulating layer BI1 may be disposed such that it is in contact with the sidewall of the first memory pattern ML1. That is, the first blocking insulating layer BI1 may be disposed between the sidewall of the first memory pattern ML1 and the sidewalls of the third layer SL3, the first interlayer insulating layers ILD1, and the first conductive patterns CP1. Also, the first blocking insulating layer BI1 may be disposed such that it is in contact with the sidewall and the lower surface of the second memory pattern ML2. That is, the first blocking insulating layer BI1 may be disposed between the sidewalls of the second memory pattern ML2 and the first layer SL1 and between the lower surfaces of the second memory pattern ML2 and the first layer SL1.

The first blocking insulating layer BI1, the data storage layer DL, and the tunnel insulating layer TI may extend from between the first stacked body ST1 and the channel layer CL to between the third layer SL3 and the channel layer CL. The first blocking insulating layer BI1, the data storage layer DL, and the tunnel insulating layer TI of the second memory pattern ML2 may extend between the first layer SL1 and the channel layer CL.

A second blocking insulating layer BI2 may be disposed between the first blocking insulating layer BI1 of the first memory pattern ML1 and the first conductive pattern CP1.

Figure 7:
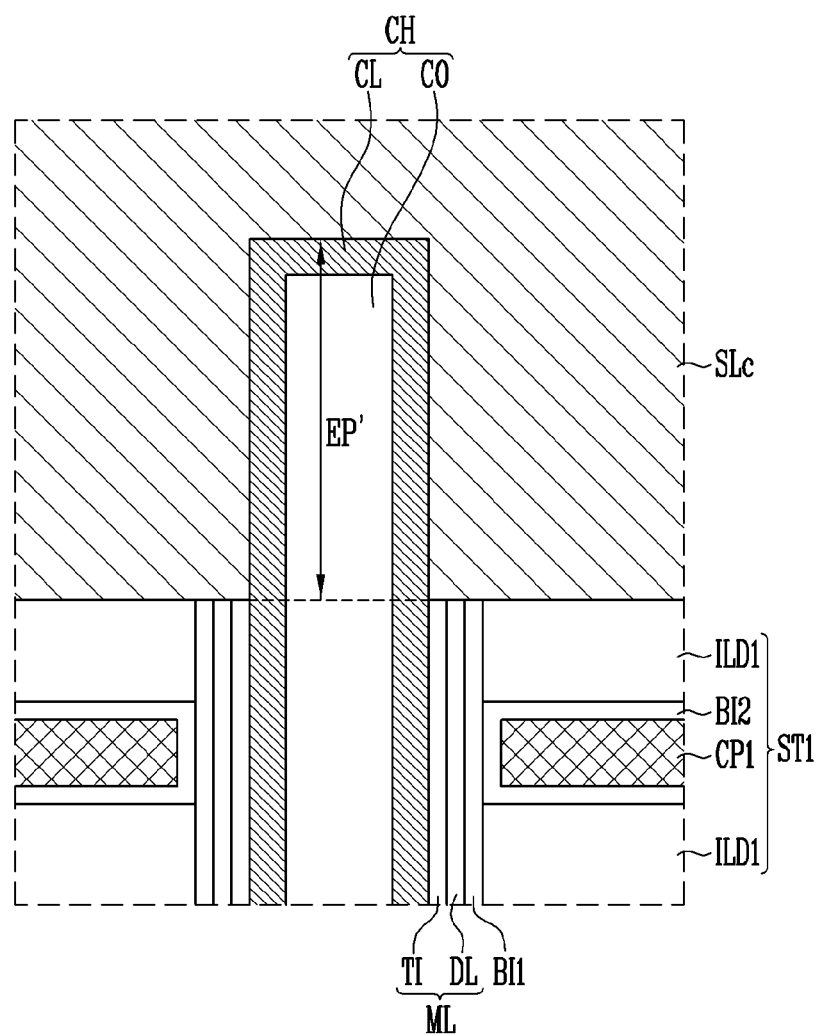
FIG. 7 is a sectional view illustrating a source layer and a channel structure according to an embodiment of the present disclosure.

FIG. 7 is a sectional view illustrating a source layer SLc and a channel structure CH according to an embodiment of the present disclosure. The structure illustrated in FIG. 7 may be applied to the semiconductor memory device 10B illustrated in FIG. 3B.

Referring to FIG. 7, the source layer SLc may overlap a first stacked body ST1, and may include a doped semiconductor layer. According to an embodiment, the source layer SLc may include n-type doped silicon. The first stacked body ST1 may be disposed between the source layer SLc and the second stacked body ST2 described with reference to FIG. 4.

The first stacked body ST1 may include alternately stacked first interlayer insulating layers ILD1 and first conductive patterns CP1, as is described with reference to FIG. 4, and may be penetrated by the channel structure CH.

The end portion EP' of the channel structure CH may penetrate a first blocking insulating layer BI1, penetrate the data storage layer DL and the tunnel insulating layer TI of a memory layer ML, and extend into the source layer SLc. According to an embodiment, a channel layer CL and a core insulating layer CO may extend into the source layer SLc. A portion of the channel layer CL forming the end portion EP' of the channel structure CH may be in contact with the source layer SLc.

FIGS. 8A to 8C, FIGS. 9A to 9C, and FIGS. 10A to 10C are sectional views illustrating a method of manufacturing a memory cell array according to an embodiment of the present disclosure.

Figure 8A:
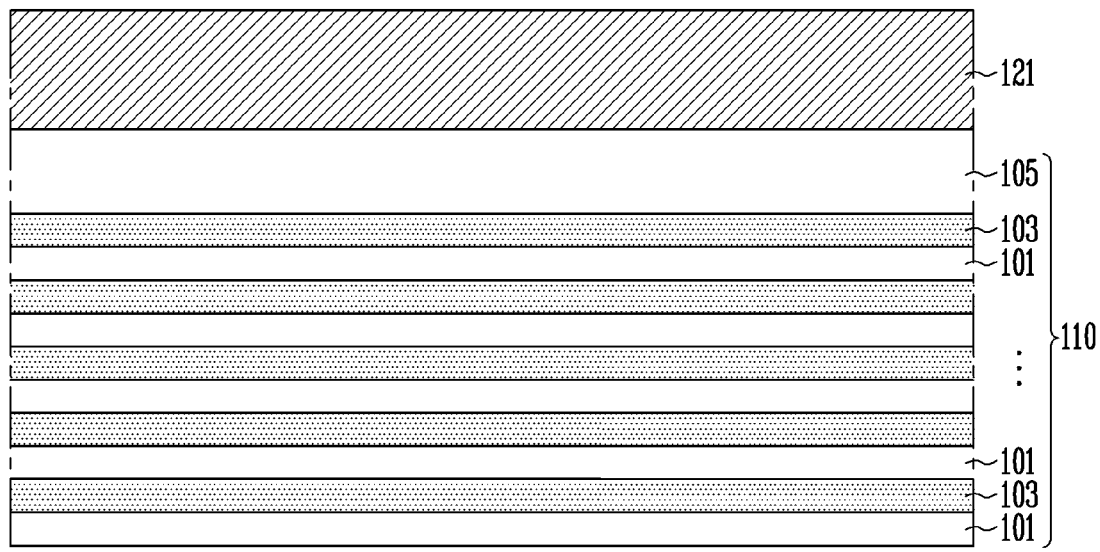
FIGS. 8A, 8B, and 8C, FIGS. 9A, 9B, and 9C, and FIGS. 10A, 10B, and 10C are sectional views illustrating a method of manufacturing a memory cell array according to an embodiment of the present disclosure.
Figure 8B:
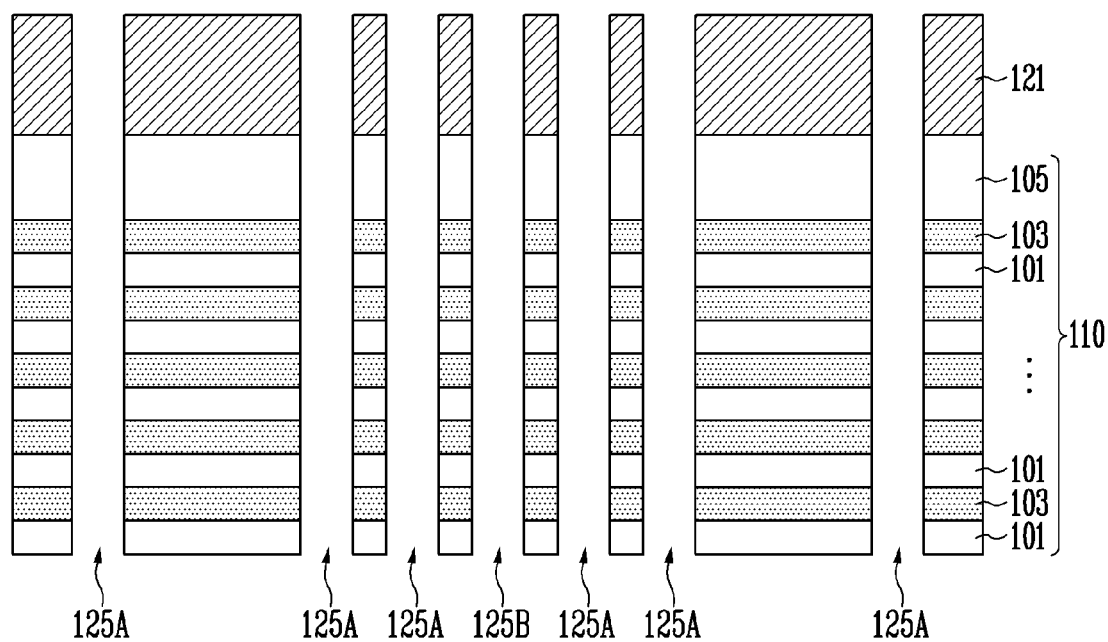
Figure 8C:
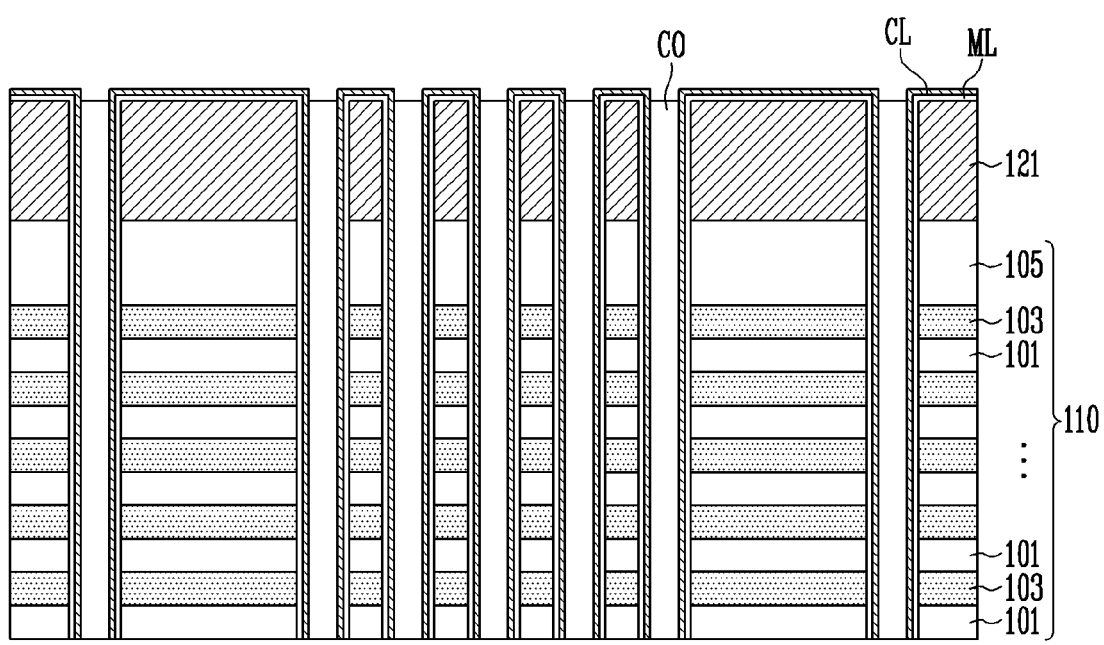

FIGS. 8A to 8C are sectional views illustrating the step of forming a preliminary stacked body 110 and the step of forming channel structures penetrating the preliminary stacked body 110 and surrounded by memory layers 130A.

Referring to FIG. 8A, the step of forming the preliminary stacked body 110 may include the step of alternately stacking first interlayer insulating layers 101 and sacrificial layers 103. Each of the sacrificial layers 103 may include a material having an etching selectivity with respect to the first interlayer insulating layers 101. According to an embodiment, the first interlayer insulating layers 101 may include a silicon oxide, and the sacrificial layers 103 may include a silicon nitride. Then, a second interlayer insulating layer 105 is formed on the uppermost stacked sacrificial layer 103. For example, the first interlayer insulating layers 101 and the sacrificial layers 103 are alternately stacked on a semiconductor substrate, and the second interlayer insulating layer 105 is stacked on the uppermost stacked sacrificial layer 103, whereby the preliminary stacked body 110 is formed.

Then, a mask layer 121 is formed above the preliminary stacked body 110. The mask layer 121 may include a nitride layer.

Referring to FIG. 8B, channel holes 125A may be formed by etching the mask layer 121 and the preliminary stacked body 110. The channel holes 125A may pass through the preliminary stacked body 110. At the step of forming the channel holes 125A, a dummy hole 125B passing through the preliminary stacked body 110 may be formed simultaneously with the channel holes 125A.

The channel holes 125A and the dummy hole 125B may be defined by etching the mask layer 121 and the preliminary stacked body 110 using a photoresist pattern (not illustrated), which is formed through a photolithography process, as an etching barrier. After the channel holes 125A and the dummy hole 125B are formed, the photoresist pattern may be removed.

Referring to FIG. 8C, a memory layer ML covering the surfaces of the channel holes and the surface of the dummy hole and extending over the surface of the mask layer 121 may be formed. The memory layer ML may include a data storage layer and a tunnel insulating layer. Then, a channel layer CL may be formed along the surface of the memory layer ML.

After the channel layer CL is formed, the central regions of the channel holes and the central region of the dummy hole may be filled with a core insulating layer CO.

Figure 9A:
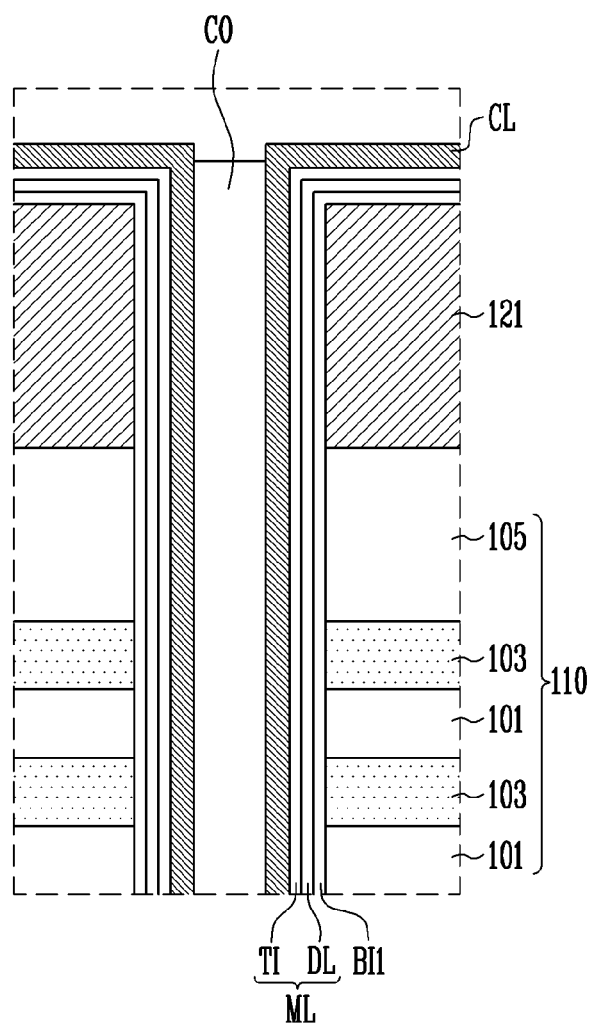
Figure 9B:
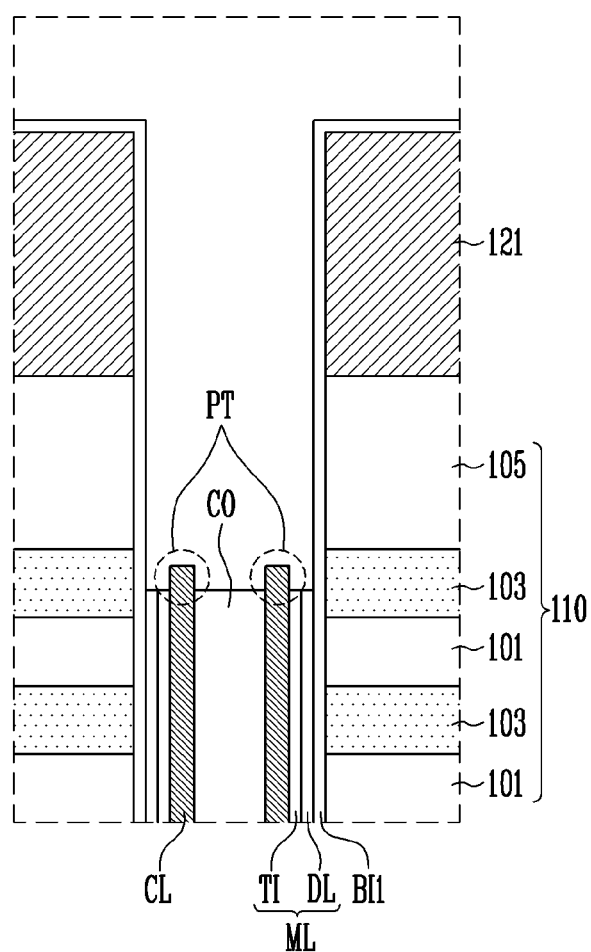
Figure 9C:
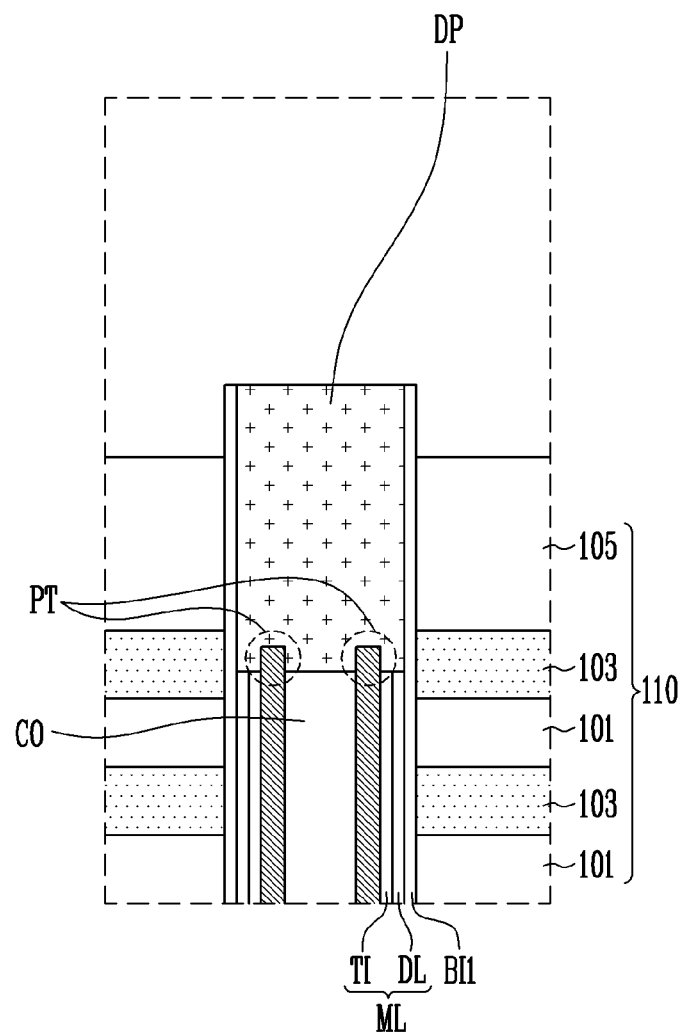

FIGS. 9A to 9C are enlarged sectional views, and illustrate an embodiment for the step of forming the memory layer ML, the channel layer CL, the core insulating layer CO, and a doped semiconductor pattern DP in the channel hole.

Referring to FIG. 9A, the step of forming the memory layer ML, the channel layer CL, and the core insulating layer CO, illustrated in FIG. 8C, may include the step of forming a first blocking insulating layer BI1 on the surface of each of the channel holes and the dummy hole. The first blocking insulating layer BI1 may include an oxide.

Then, the data storage layer DL and the tunnel insulating layer TI are sequentially formed along the surface of the first blocking insulating layer BI1, whereby the memory layer ML may be formed. The tunnel insulating layer TI may include an insulating material enabling charge tunneling. According to an embodiment, the tunnel insulating layer TI may include a silicon oxide layer. The data storage layer DL may include a material layer capable of storing data. To this end, the data storage layer DL may be formed of a nitride layer enabling charge trapping. The present disclosure is not limited thereto, and the data storage layer DL may include a phase-change material, a nanodot, and the like.

Then, the channel layer CL may be formed along the surface of the tunnel insulating layer TI. The channel layer CL may include a silicon layer.

Then, the core insulating layer CO is formed along the surface of the channel layer CL, in which case the core insulating layer CO may be formed to fill the inside of the channel hole. The core insulating layer CO may be formed by depositing an oxide layer using an atomic layer deposition (ALD) method. Then, an etch back process may be performed on the core insulating layer CO such that the core insulating layer CO remains only inside the channel hole.

Referring to FIG. 9B, the core insulating layer CO may be etched through a dry etching process such that the upper surface of the core insulating layer CO is placed at the height corresponding to the middle portion of at least one sacrificial layer 103 that is located uppermost, among the sacrificial layers 103.

Then, the exposed channel layer CL may be etched such that the upper surface of the channel layer CL is placed at the height corresponding to the upper portion of the sacrificial layer 103 that is located uppermost, among the sacrificial layers 103.

Then, the exposed tunnel insulating layer TI and data storage layer DL may be sequentially etched such that the upper surface of the memory layer ML is placed at the height corresponding to the middle portion of the sacrificial layer 103 that is located uppermost, among the sacrificial layers 103.

Accordingly, the channel layer CL has a protrusion PT that protrudes with respect to the upper surfaces of the memory layer ML and the core insulating layer CO. The protrusion PT extends up to the height corresponding to the upper portion of the uppermost located sacrificial layer 103.

In the above-described embodiment according to FIG. 9B, the exposed tunnel insulating layer TI and data storage layer DL are sequentially etched such that the upper surface of the memory layer ML is placed at the height corresponding to the middle portion of the sacrificial layer 103. However, according to another embodiment, an etching process may be performed such that only the tunnel insulating layer TI is etched to place the upper surface of the tunnel insulating layer TI at the height corresponding to the middle portion of the sacrificial layer 103 and such that the data storage layer DL remains at the sidewall of the protrusion PT.

Referring to FIG. 9C, a doped semiconductor layer is deposited on the entire structure including the memory layer ML, the protrusion PT of the channel layer CL, and the upper portion of the core insulating layer CO, and a planarization etching process is performed such that the mask layer is exposed, whereby a doped semiconductor pattern DP is formed above the memory layer ML, the protrusion PT of the channel layer CL, and the core insulating layer CO. The doped semiconductor pattern DP may include an n-type doped silicon layer. The is doped semiconductor pattern DP is formed in the space between the protrusion PT and the first blocking insulating layer BI1 and above the core insulating layer CO. Accordingly, the protrusion PT has a structure extending into the doped semiconductor pattern DP. Also, the doped semiconductor pattern DP is formed in the upper sidewall portion of the uppermost located sacrificial layer 103 with the first blocking insulating layer BI1 therebetween.

Figure 10A:
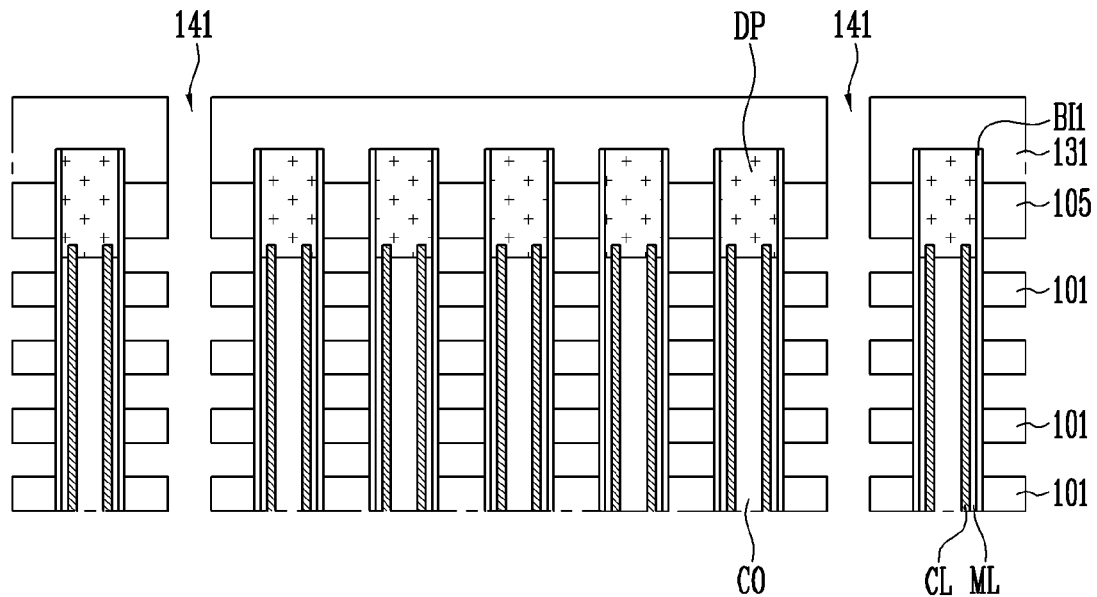
Figure 10B:
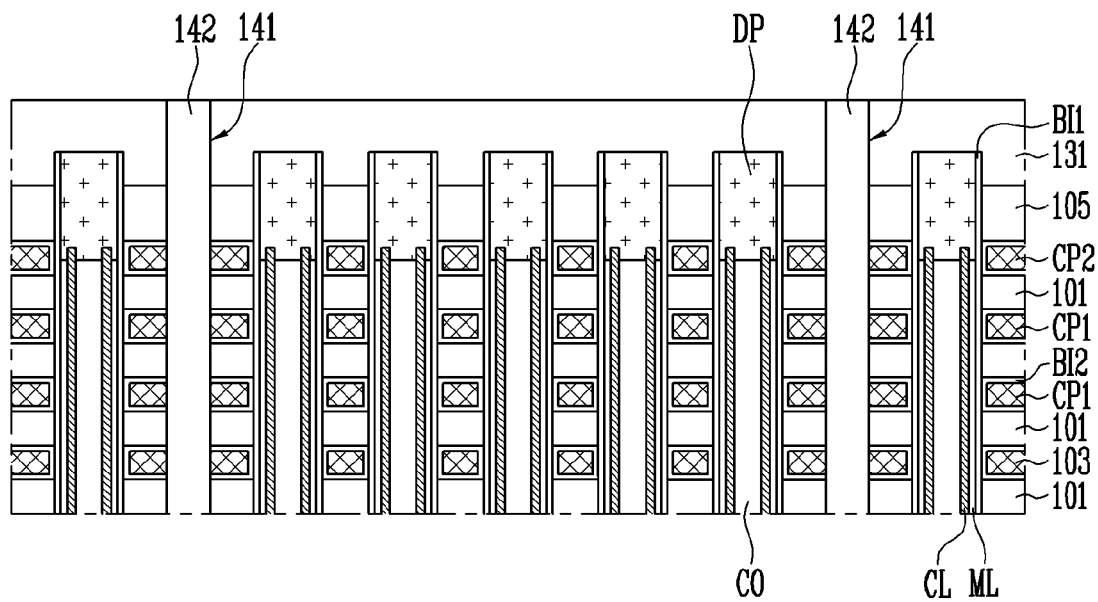
Figure 10C:
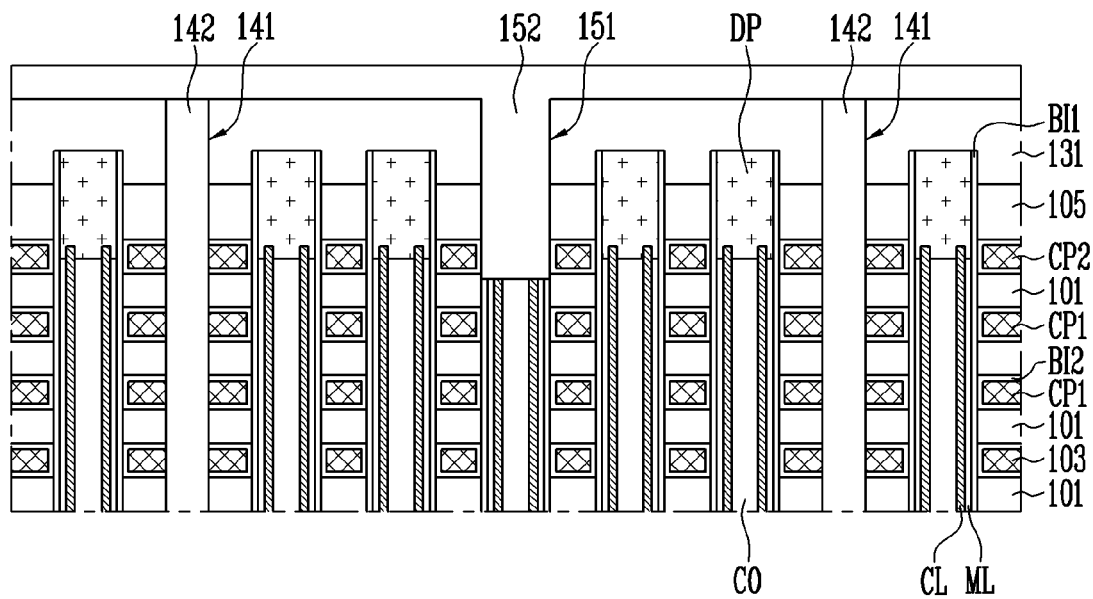

FIGS. 10A to 10C illustrate an embodiment for the step of forming first conductive patterns and a second conductive pattern in the space between the first interlayer insulating layers 101.

Referring to FIG. 10A, after the process illustrated in FIG. 9C is performed, a mask layer 131 for forming a slit is formed on the entire structure including the doped semiconductor pattern DP. Then, the second interlayer insulating layer 105 and the alternately stacked sacrificial layers and first interlayer insulating layers are sequentially etched by performing an etching process using the mask layer 131 for forming a slit, whereby a second slit 141 is formed. Then, the sacrificial layers exposed through the second slit 141 are removed. Accordingly, an empty space is formed between the first interlayer insulating layers 101 and between the uppermost disposed first interlayer insulating layer 101 and the second interlayer insulating layer 105.

Referring to FIG. 10B, the empty space between the first interlayer insulating layers 101 and between the first interlayer insulating layer 101 and the second interlayer insulating layer 105 is filled with a is conductive material, whereby first conductive patterns CP1 and a second conductive pattern CP2 are formed. The first conductive patterns CP1 and the second conductive pattern CP2 may include a conductive material having a lower resistance than silicon. According to an embodiment, the first conductive patterns CP1 and the second conductive pattern CP2 may include a metal layer. The first conductive patterns CP1 are formed in the space between the first interlayer insulating layers 101, and the second conductive pattern CP2 is formed in the space between the uppermost first interlayer insulating layer 101 and the second interlayer insulating layer 105.

Before the first conductive patterns CP1 and the second conductive pattern CP2 are formed, a second blocking insulating layer BI2 may be formed on the surface of the empty space. The second blocking insulating layer BI2 may include an insulating material having a higher dielectric constant than the first blocking insulating layer BI1. According to an embodiment, the second blocking insulating layer BI2 may include an aluminum oxide layer.

Referring to FIG. 10C, the second slit 141 is filled with an insulating material 142. Then, a first slit 151 is formed on the dummy channel structure. The first slit 151 may be formed in a line shape, and the second conductive pattern CP2 surrounding the dummy channel structure is separated into two end portions by the first slit 151. Then, the first slit 151 is filled with an insulating material 152.

According to an above-described embodiment of the present disclosure, a doped semiconductor pattern DP is disposed in a portion of the channel region of a drain select transistor, and a channel layer CL is disposed in the remaining portion thereof. Accordingly, even though an impurity diffusion process by heat treatment is not performed, the doped semiconductor pattern DP doped with impurities is disposed in the channel region of the drain select transistor, whereby a junction overlap region is formed. Accordingly, a Gate-Induced Drain Leakage (GIDL) current generated at the channel under the drain select transistor may be increased during the erase operation of a semiconductor memory device.

Figure 11:
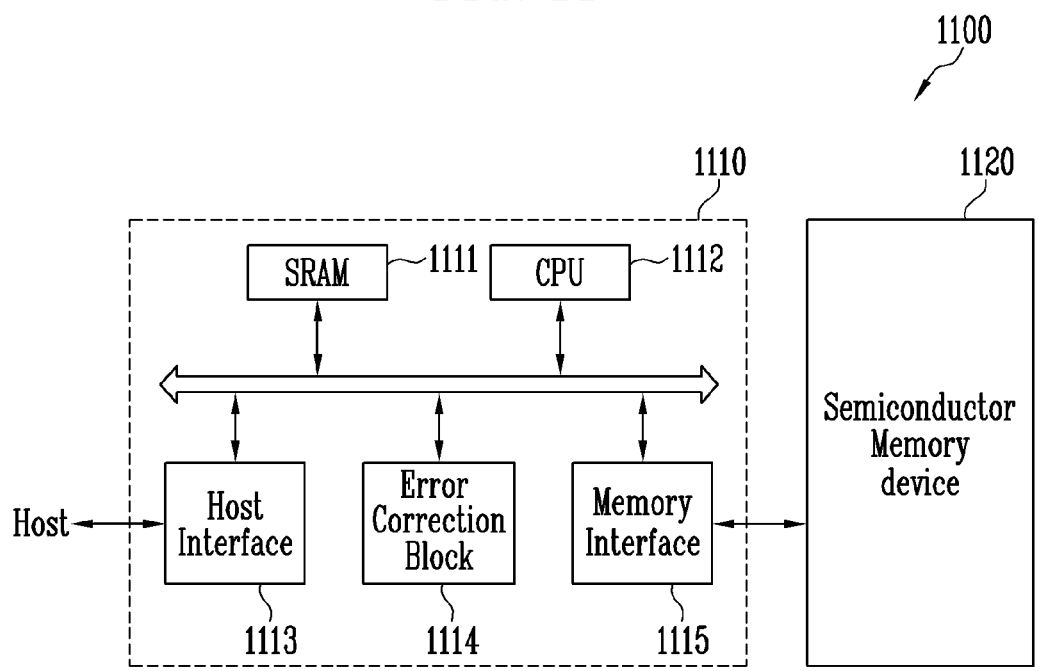
FIG. 11 is a block diagram illustrating the configuration of a memory system according to an embodiment of the present disclosure.

FIG. 11 is a block diagram illustrating the configuration of a memory system 1100 according to an embodiment of the present disclosure.

Referring to FIG. 11, the memory system 1100 includes a semiconductor memory device 1120 and a memory controller 1110.

The semiconductor memory device 1120 may include a select line that is passed through by a hole, a memory layer formed on the sidewall of the hole, and a doped semiconductor pattern filling a portion of the hole. The semiconductor memory device 1120 may be configured as the semiconductor memory devices illustrated in FIG. 4.

The semiconductor memory device 1120 may be a multi-chip package configured with a plurality of flash memory chips.

The memory controller 1110 is configured to control the semiconductor memory device 1120, and may include a Static Random Access Memory (SRAM) 1111, a Central Processing Unit (CPU) 1112, a host interface 1113, an error correction block 1114, and a memory interface 1115. The SRAM 1111 is used as the operating memory of the CPU 1112, the CPU 1112 performs an overall control operation for data exchange of the memory controller 1110, and the host interface 1113 has the data exchange protocol of a host coupled to the memory system 1100. Also, the error correction block 1114 detects and corrects errors included in data read from the memory device 1120, and the memory interface 1115 performs interfacing with the memory device 1120. Additionally, the memory controller 1110 may further include a Read-Only Memory (ROM) configured to store code data for interfacing with the host, and the like.

Figure 12:
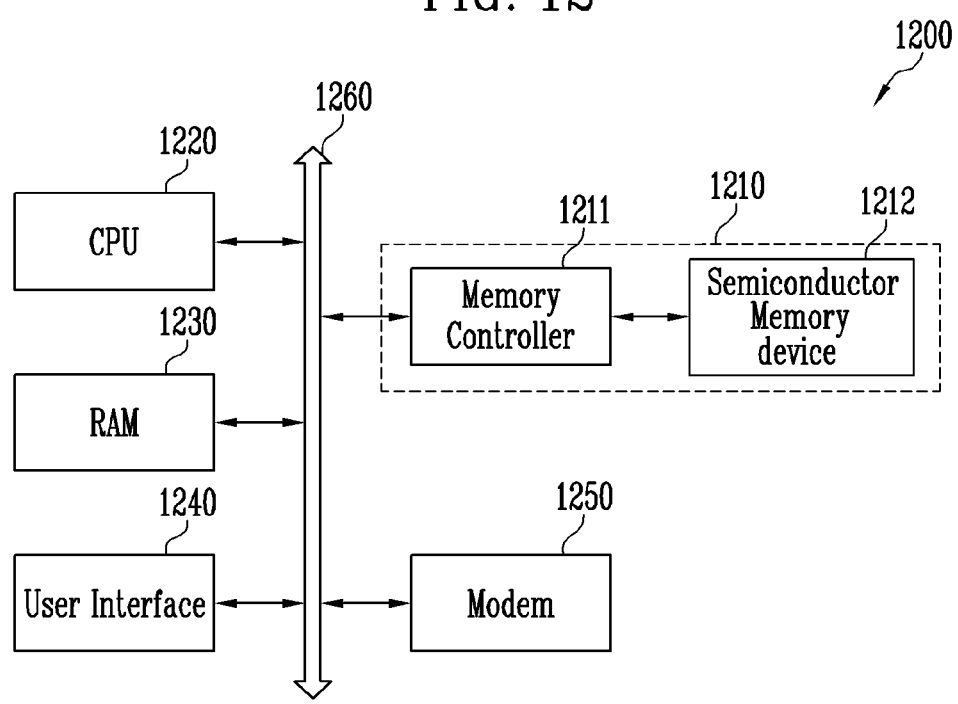
FIG. 12 is a block diagram illustrating the configuration of a computing system according to an embodiment of the present disclosure.

FIG. 12 is a block diagram illustrating the configuration of a computing system according to an embodiment of the present disclosure.

Referring to FIG. 12, the computing system 1200 according to an embodiment of the present disclosure may include a CPU 1220, a Random Access Memory (RAM) 1230, a user interface 1240, a modem 1250, and a memory system 1210, which are electrically coupled to a system bus 1260. The computing system 1200 may be a mobile device.

The memory system 1210 may include a semiconductor memory device 1212 and a memory controller 1211. The semiconductor memory device 1212 may include a select line that is passed through by a hole, a memory layer formed on the sidewall of the hole, and a doped semiconductor pattern filling a portion of the hole. The semiconductor memory device 1212 may be configured as the semiconductor memory devices illustrated in FIG. 4.

The present disclosure may stably generate a Gate-Induced Drain Leakage (GIDL) current for an erase operation by improving the characteristics of a drain select transistor, thereby improving the reliability of the operation of a semiconductor memory device.

While the examples of embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

What is claimed is:

1. A method of manufacturing a semiconductor memory device, comprising:
    forming a preliminary stacked body including alternately stacked interlayer insulating layers and sacrificial layers;
    forming a channel hole passing through the preliminary stacked body;
    forming a memory layer extending along a sidewall of the channel hole;
    forming a channel layer extending along a surface of the memory layer;
    forming a core insulating layer along a surface of the channel layer and the core insulating layer filling the channel hole;
    etching the core insulating layer, the channel layer, and the memory layer disposed in an upper portion of the channel hole such that the channel layer has a protrusion protruding with respect to the core insulating layer and the memory layer; and
    forming a doped semiconductor pattern in the upper portion of the channel hole,
    wherein the memory layer is etched such that an upper surface of the memory layer is placed at a height corresponding to a portion of a sidewall of an upper sacrificial layer disposed uppermost, among the sacrificial layers.

2. The method according to claim 1, wherein the core insulating layer is etched such that an upper surface of the core insulating layer is placed at the height, and
    the channel layer is etched such that an upper surface of the channel layer is higher than the upper surfaces of the core insulating layer and the memory layer.

3. The method according to claim 1, wherein forming the doped semiconductor pattern is configured to form the doped semiconductor pattern such that the protrusion of the channel layer extends into the doped semiconductor pattern.

4. The method according to claim 1, further comprising:
    before forming the memory layer, forming a blocking insulating layer extending along a surface of the channel hole.

5. The method according to claim 1, further comprising:
    forming a slit penetrating the preliminary stacked body;
    removing the sacrificial layers exposed through the slit; and
    forming conductive patterns in a space from which the sacrificial layers are removed.

6. The method according to claim 5, wherein:
    a portion of a sidewall of an upper conductive pattern disposed uppermost, among the conductive patterns, overlaps the memory layer, and
    a remaining portion of the sidewall of the upper conductive pattern, excluding the portion, overlaps the doped semiconductor pattern.

* * * * *